United States Patent
Leong et al.

(10) Patent No.: US 9,076,735 B2
(45) Date of Patent: Jul. 7, 2015

(54) METHODS FOR FABRICATING INTEGRATED CIRCUITS USING CHEMICAL MECHANICAL POLISHING

(71) Applicant: GLOBALFOUNDRIES Singapore Pte. Ltd., Singapore (SG)

(72) Inventors: Lup San Leong, Singapore (SG); Alan Cing Gie Lim, Singapore (SG); Ling Wu, Singapore (SG); Jian Bo Yang, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 14/092,217

(22) Filed: Nov. 27, 2013

(65) Prior Publication Data

US 2015/0147872 A1    May 28, 2015

(51) Int. Cl.
*H01L 21/306* (2006.01)
*H01L 21/02* (2006.01)

(52) U.S. Cl.
CPC .... *H01L 21/30625* (2013.01); *H01L 21/02532* (2013.01); *H01L 21/02595* (2013.01)

(58) Field of Classification Search
CPC ............................................ H01L 2224/03616
USPC ......................................................... 438/488
See application file for complete search history.

(56) References Cited

U.S. PATENT DOCUMENTS

| | | | |
|---|---|---|---|
| 2002/0158280 A1* | 10/2002 | Shinkawata | 257/296 |
| 2003/0211691 A1* | 11/2003 | Ueda | 438/258 |
| 2005/0170588 A1* | 8/2005 | Lee et al. | 438/275 |
| 2007/0035984 A1* | 2/2007 | Arai | 365/145 |
| 2010/0001369 A1* | 1/2010 | Chuang et al. | 257/526 |
| 2011/0188329 A1* | 8/2011 | Kawahara et al. | 365/189.16 |
| 2014/0065776 A1* | 3/2014 | Mihara | 438/239 |
| 2014/0208041 A1* | 7/2014 | Hyde et al. | 711/146 |

* cited by examiner

*Primary Examiner* — Mamadou Diallo
(74) *Attorney, Agent, or Firm* — Ingrassia Fisher & Lorenz, P.C.

(57) ABSTRACT

Methods for fabricating integrated circuits are disclosed. In an exemplary embodiment, a method for fabricating an integrated circuit includes forming a silicon material layer over a semiconductor substrate. The semiconductor substrate includes a logic device region and a memory array region. The memory array region has a memory device formed on the semiconductor substrate. The method further includes forming a capping layer over the silicon material layer and over the memory device and removing the capping layer from over the memory device in the memory array region using a first chemical mechanical polishing process while leaving at least a first portion of the capping layer in place over the logic device region. Further, the method includes removing the first silicon material layer from over the memory device in the memory array region using a second chemical mechanical polishing process.

17 Claims, 4 Drawing Sheets

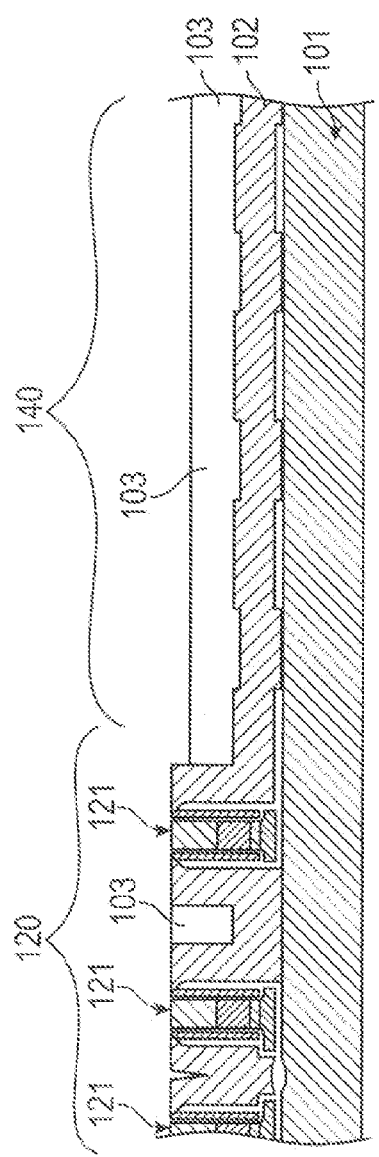
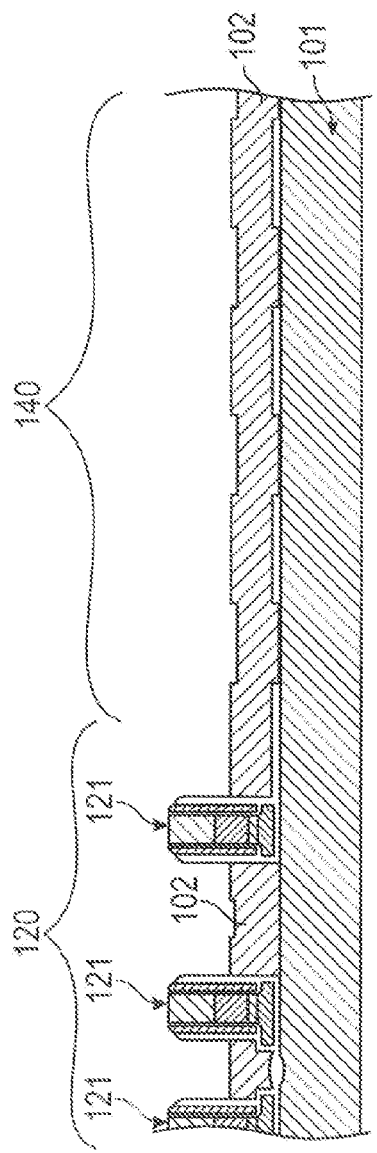

US 9,076,735 B2

METHODS FOR FABRICATING INTEGRATED CIRCUITS USING CHEMICAL MECHANICAL POLISHING

TECHNICAL FIELD

The present disclosure generally relates to methods for fabricating integrated circuits. More particularly, the present disclosure relates to methods for fabricating integrated circuits using chemical mechanical polishing.

BACKGROUND

The majority of present day integrated circuits are implemented by using a plurality of interconnected field effect transistors (FETs), also called metal oxide semiconductor field effect transistors (MOSFETs), or simply MOS transistors. A MOS transistor includes a gate electrode as a control electrode and spaced apart source and drain regions between which a current can flow. A control voltage applied to the gate electrode controls the flow of current through a channel between the source and drain regions.

The fabrication of advanced integrated circuits, such as CPUs, storage devices, ASICs (application specific integrated circuits), and the like requires the formation of a large number of circuit elements in a given chip area according to a specified circuit layout. Many modern integrated circuit chips may have one or more "logic regions" where primarily logic circuits or logic devices reside and one or more "memory regions or arrays" that primarily contain memory devices. Although the logic devices and memory devices are often formed on the same chip and frequently share common materials, such devices do have fundamental structural differences, and they are often formed at different times during a particular process flow that is performed to form the completed device.

The basic structures of the logic devices and memory devices are fabricated by forming various layers of material and thereafter patterning those layers of material using photolithography and etching processes. Often, this basic layer "stack" for the memory devices is formed prior to fabricating the gate electrode structures for the logic regions of the device. Thus, the process designer is often faced with the challenge of ensuring that process steps employed in the fabrication of one device do not harm other devices that are previously or concurrently fabricated.

Over recent years, there has been a constant drive to reduce the physical size of various consumer electronic products that employ integrated circuits. The demand for smaller consumer products with greater capability has resulted in the scaling or reduction in the physical size of integrated circuit devices that are employed in such consumer products. The reduction in size of the integrated circuits has been achieved by, among other things, reducing the physical size of the various semiconductor devices, e.g., the transistors, and by greatly increasing the density of such transistors in a given area.

With reduction in physical size, however, there is a greater likelihood that the processes employed in the fabrication of one device of the integrated circuit may adversely affect the prior or concurrent fabrication of other devices due to increased proximity of the devices. In one such example, during the polishing of a polycrystalline silicon layer over the memory devices, such as through chemical mechanical polishing (CMP), which as noted above may be formed in part prior to the formation of the logic devices, it is often desirable to prevent any polishing of the same polycrystalline silicon layer from occurring in the logic areas (i.e., areas where logic devices are to be formed), due to certain thickness requirements of the polysilicon layer in the logic areas. Thus, as currently practiced in the art, a protective material layer (typically a silicon oxide material) is deposited over the device, and then removed only from the memory devices, prior to polishing, such that the protective layer remains in place over the logic areas during polishing, which ensures the desired polycrystalline silicon thickness will remain. However, the deposition of the extra protective material layer requires an extra masking and etching step (to remove it from the memory devices) prior to the CMP step. This extra step undesirably increases the time and cost required in the fabrication of the semiconductor device.

Accordingly, it is desirable to provide improved methods for fabricating integrated circuits that reduce the time and cost required for the fabrication process. Additionally, it is desirable to provide methods for fabricating integrated circuits that eliminate the need for the masking and etching of protective layers prior to polishing. Furthermore, other desirable features and characteristics of the present disclosure will become apparent from the subsequent detailed description and the appended claims, taken in conjunction with the accompanying drawings and the foregoing technical field and background.

BRIEF SUMMARY

Methods for fabricating integrated circuits are disclosed. In an exemplary embodiment, a method for fabricating an integrated circuit includes forming a silicon material layer over a semiconductor substrate. The semiconductor substrate includes a logic device region and a memory array region. The memory array region has a memory device formed on the semiconductor substrate. The method further includes forming a capping layer over the silicon material layer and over the memory device and removing the capping layer from over the memory device in the memory array region using a first chemical mechanical polishing process while leaving at least a first portion of the capping layer in place over the logic device region. Further, the method includes removing the first the silicon material layer from over the memory device in the memory array region using a second chemical mechanical polishing process while leaving at least a second portion of the capping layer in place over the logic device region. The at least a second portion has a thickness that is less than the at least a first portion.

In another exemplary embodiment, a method for fabricating an integrated circuit includes forming a silicon material layer over a semiconductor substrate, the semiconductor substrate including a logic device region and a memory array region, the memory array region having formed on the semiconductor substrate a memory device and forming a capping layer over the silicon material layer and over the memory device. The method further includes removing the capping layer from over the memory device in the memory array region using a first chemical mechanical polishing process while leaving at least a first portion of the capping layer in place over the logic device region. Performing the first chemical mechanical polishing process includes applying a hard pad to the semiconductor substrate. Still further, the method includes removing the first the silicon material layer from over the memory device in the memory array region using a second chemical mechanical polishing process while leaving at least a second portion of the capping layer in place over the logic device region, the at least a second portion having a thickness that is less than the at least a first portion. Performing the second chemical mechanical polishing process includes applying a soft pad to the semiconductor substrate.

In yet another exemplary embodiment, a method for fabricating an integrated circuit includes forming a silicon material layer over a semiconductor substrate, the semiconductor substrate including a logic device region and a memory array region, the memory array region having formed on the semiconductor substrate a memory device and forming a capping layer over the silicon material layer and over the memory device. The method further includes removing the capping layer from over the memory device in the memory array region using a first chemical mechanical polishing process while leaving at least a first portion of the capping layer in place over the logic device region. Performing the first chemical mechanical polishing process includes applying a slurry having a selectivity on the basis of polysilicon:silicon oxide:silicon nitride of about 200 to about 300:1:1. Still further, the method includes removing the first the silicon material layer from over the memory device in the memory array region using a second chemical mechanical polishing process while leaving at least a second portion of the capping layer in place over the logic device region, the at least a second portion having a thickness that is less than the at least a first portion. Performing the second chemical mechanical polishing process includes applying a slurry having a selectivity on the basis of polysilicon:silicon oxide:silicon nitride of about 500:1:1.

BRIEF DESCRIPTION OF THE DRAWINGS

The present disclosure will hereinafter be described in conjunction with the following drawing figures, wherein like numerals denote like elements, and wherein:

FIGS. 1-5 illustrate, in cross section, integrated circuit structures and methods for fabricating integrated circuit structures in accordance with various embodiments contemplated herein.

DETAILED DESCRIPTION

Figure 1:
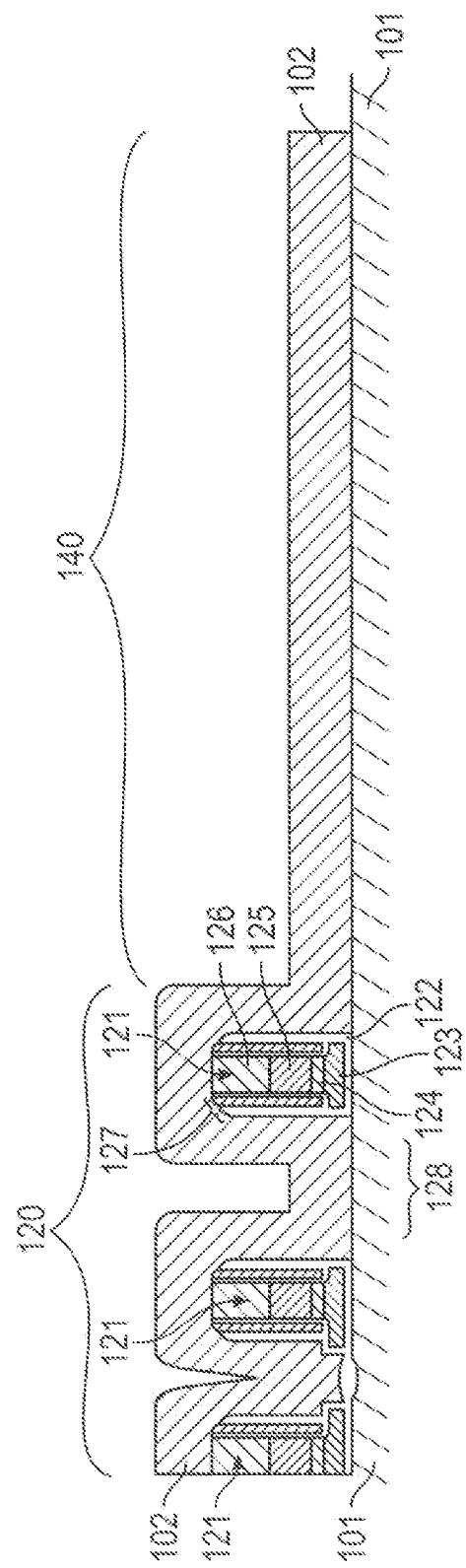

The following detailed description is merely illustrative in nature and is not intended to limit the embodiments of the subject matter or the application and uses of such embodiments. Furthermore, there is no intention to be bound by any expressed or implied theory presented in the preceding technical field, background, brief summary or the following detailed description.

The present disclosure provides improved methods for the fabrication of integrated circuits that include a logic device and a memory array in close proximity to one another, such as on the same layout block of the integrated circuit. The methods described herein employ an improved polishing technique for polishing a deposited layer of polycrystalline silicon that eliminates that need for masking and etching of a protective layer over certain portions of the polycrystalline silicon layer to prevent the polishing thereof in such portions. In particular, the improved polishing techniques employ the use of both a "hard" polishing pad and a "soft" polishing pad, in sequence, to eliminate the need for the masking and etching of the protective layer over the polycrystalline silicon in a memory region of the device. Alternatively or additionally, the improved polishing techniques employ the use of differently selective chemical polishing slurries, in sequence. As such, the present disclosure provides methods for fabricating integrated circuits that require fewer processing steps, and thus require less time and less money to perform.

For the sake of brevity, conventional techniques related to integrated circuit device fabrication may not be described in detail herein. For example, the illustrated embodiments show the integrated circuits at a stage of fabrication where the gate stacks of the memory array device have been previously formed using techniques know in the art because, as noted above, memory devices are often formed prior to the fabrication of the logic devices. Moreover, the various tasks and process steps described herein may be incorporated into a more comprehensive procedure or process having additional steps or functionality not described in detail herein. In particular, various steps in the manufacture of semiconductor-based transistors are well-known and so, in the interest of brevity, many conventional steps will only be mentioned briefly herein or will be omitted entirely without providing the well-known process details. As such, the embodiments described herein, again for the sake of brevity, commence discussion after the gate stacks for the memory array have been formed.

In an embodiment, a method for fabricating an integrated circuit includes forming a first silicon material layer, for example a polycrystalline silicon (hereinafter "polysilicon") layer, over a semiconductor substrate. The semiconductor substrate includes a logic device region and a memory array region, the memory array region having formed on the semiconductor substrate a memory device (or a plurality of memory devices). As illustrated in cross section in FIG. 1, a semiconductor substrate 101 includes a memory array region 120 and a logic device region 140. Although in the Figures region 120 is illustrated separate from region 140, it will be appreciated that integrated circuits are provided in numerous different designs, and as such the particular configuration illustrated in the Figures is not to be understood as limiting. The semiconductor substrate 101 is preferably a silicon substrate having a (100) surface crystal orientation. The term "silicon substrate" is used herein to encompass the relatively pure silicon materials typically used in the semiconductor industry as well as silicon admixed with other elements such as germanium, carbon, and the like. A silicon substrate may be a bulk silicon wafer (as illustrated), or may be a thin layer of silicon on an insulating layer (commonly know as silicon-on-insulator or SOI) that, in turn, is supported by a carrier wafer. Alternatively, the semiconductor substrate 101 can be germanium, gallium arsenide, or other semiconductor material.

At the point of fabrication depicted in FIG. 1, the basic structure of a plurality of memory devices 121 has been formed in the memory array region 120 using known techniques and materials. In the illustrative example depicted in FIG. 1, the structure of each memory device 121 includes a gate insulation layer 122, a floating gate 123, another layer(s) of insulating material 124, a control gate 125, and a capping layer 126. Other memory devices having different structures are possible as well. One or more sidewall spacers 127 may be disposed along sidewall regions of the memory devices 121. A word-line (WL) region 128 may separate certain of the memory devices 121, as is known in the art. The memory devices 121 are intended to be representative in nature and do not include all features of a completed memory device, such as various doped regions, conductive contacts, etc. The memory devices 121 may be formed by forming the various layers of material and thereafter performing one or more etching processes to define the basic structure of the memory devices 121. In one illustrative embodiment, the gate insulation layer 122 may include, for example, silicon dioxide, which may be formed by either a thermal growth process or by a deposition process, such as a chemical vapor deposition (CVD) process, and it may have a thickness of about 5 nm to about 10 nm. The floating gate 123 and the control gate 125 may include a variety of materials such as, for example, polysilicon, etc. The floating gate 123 and the control gate 125 need not be made of the same material, although they may be. In one illustrative embodiment, both the floating gate 123 and the control gate 125 may be formed from polysilicon, they may be formed by performing a chemical vapor deposition (CVD) or a furnace process, and they each may have a thickness that ranges from about 80 nm to about 100 nm. The insulating layer 124 may include one or more layers of insulating material such as, for example a multi-layer stack of oxide-nitride-oxide (ONO), and it may have an overall thickness of about 10 nm. In other cases, different materials and different numbers of layers of materials may be employed. Thus, the particular details of the memory devices 121, the materials used in their construction, and the manner in which they are made should not be considered a limitation of the present disclosure.

As further illustrated in FIG. 1, a uniformly thick and conformal first polysilicon layer 102 is formed by CVD on the semiconductor substrate 101, including over the plurality of memory devices 121. The first polysilicon layer 102 is deposited to a thickness of about 100 nm to about 150 nm. In an example, low-pressure CVD (LPCVD) is employed for forming first polysilicon layer 102, as this technique provides a suitable conformal coating. First polysilicon layer 102 is deposited by the pyrolysis of a silicon-bearing gas such as silane and dichlorosilane, for example, at a temperature of about 600° C. to about 800° C. in an atmospheric pressure system or reduced pressure system at a low pressure of about 13.3 Pa to about 26.6 Pa. As initially noted, the first polysilicon layer 102 formed in logic region 140 may have a thickness requirement, and thus it is desirable to maintain the thickness thereof at the deposited thickness during further processing steps performed in memory region 120.

Figure 2:
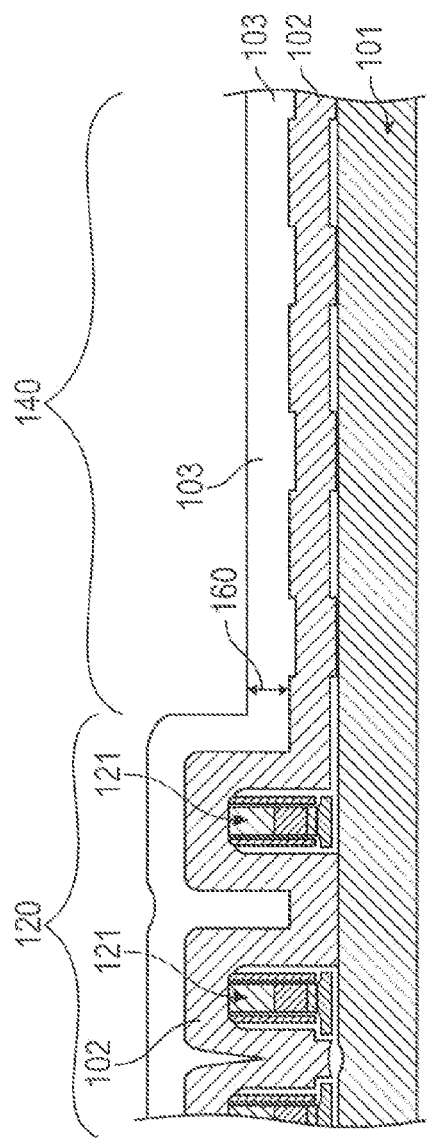

The exemplary method of fabricating the integrated circuit continues with forming a capping layer, for example a silicon oxide layer, over the polysilicon layer 102 and over the memory devices 121. With reference now to FIG. 2, a capping layer 103 is formed overlying first polysilicon layer 102. Capping layer 103 may include a deposited silicon oxide, silicon nitride, or silicon oxynitride, polycrystalline silicon, amorphous silicon, amorphous carbon (a-C), a carbon-doped silica (SiCOH), or another material suitable for providing an etch-resistant covering over the first polysilicon layer 102. Capping layer 103 may be conformally deposited using, for example, a plasma-enhanced chemical vapor deposition (PECVD), low pressure chemical vapor deposition (LPCVD), or other chemical vapor deposition (CVD) process. In an example, capping layer 103 includes silicon oxide, having a thickness of about 10 nm to about 1 micron (μm), and for example about 35 nm to about 100 nm. Due to the presence of the memory devices 121, there is a step height difference (indicated by arrow 160) between the capping layer 103 deposited over region 140 and region 120, the step height difference roughly corresponding with the height of the devices 121. In one exemplary embodiment, the step height difference may be about 1850 Å.

In the prior art, subsequent to depositing the capping layer, known methods typically include removing the capping layer from over the memory array region 120 but not from over the logic device region 140 of the integrated circuit. To perform this step in the prior art, a photoresist layer is formed over the logic device region 140, but not over the memory array region 120 utilizing conventional lithographical processing. For example, the photoresist layer is deposited over the capping layer 103. The photoresist layer may then be exposed to an image pattern and treated with a developing solution to form pattern openings within the photoresist layer. An anisotropic dry etch, such as a reactive ion etch, may then be performed utilizing a chemistry selected to etch capping layer 103 to remove the areas of capping layer 103 exposed through the pattern openings, i.e., the areas over memory array region 120, but not over logic device region 140. The remaining photoresist is then removed. These patterning and etching steps to selectively remove the capping layer 103 require additional time and expense, and as such it would be desirable to eliminate such steps from the fabrication process.

The improved fabrication technique provided herein continues, subsequent to the deposition of the capping layer 103, with a first chemical mechanical polishing (CMP) step. As known in the art, the CMP uses an abrasive and corrosive chemical slurry in conjunction with a polishing pad and retaining ring, typically of a greater diameter than the wafer. The pad and wafer are pressed together by a dynamic polishing head and held in place by a plastic retaining ring. The dynamic polishing head is rotated with different axes of rotation (i.e., not concentric). Typical CMP tools include a rotating and extremely flat platen that is covered by a pad. The wafer that is being polished is mounted upside-down in a carrier/spindle on a backing film. The retaining ring keeps the wafer in the correct horizontal position. A slurry introduction mechanism deposits the slurry on the pad. Both the platen and the carrier are then rotated and the carrier is kept oscillating as well. A downward pressure/down force is applied to the carrier, pushing it against the pad. The down force applied depends on the contact area which, in turn, is dependent on the structures of both the wafer and the pad.

Figure 6:
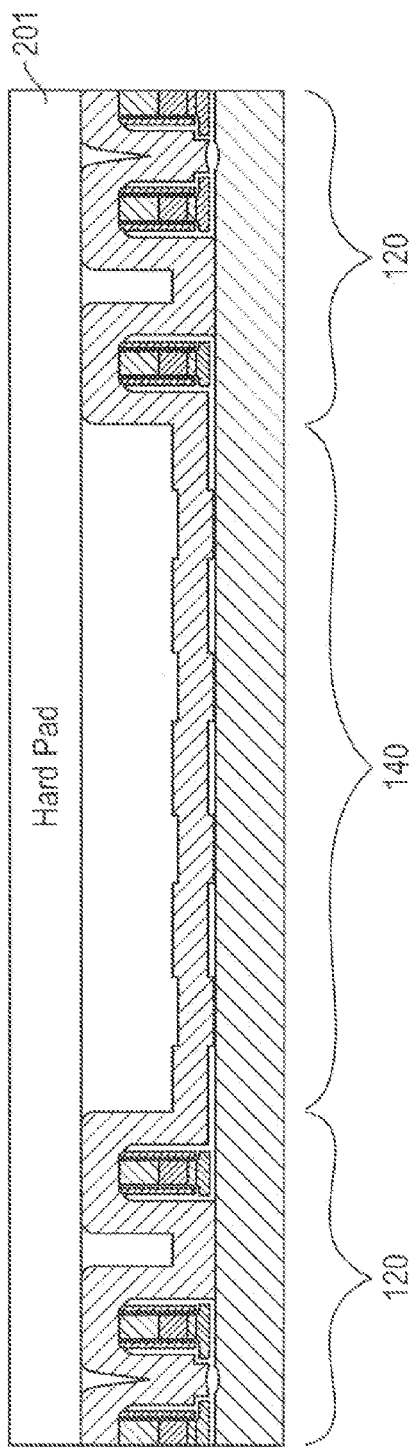
FIGS. 6-7 illustrate, in cross section, polishing pads suitable for use in the various integrated circuit fabrication method embodiments illustrated in FIGS. 1-5.
Figure 7:
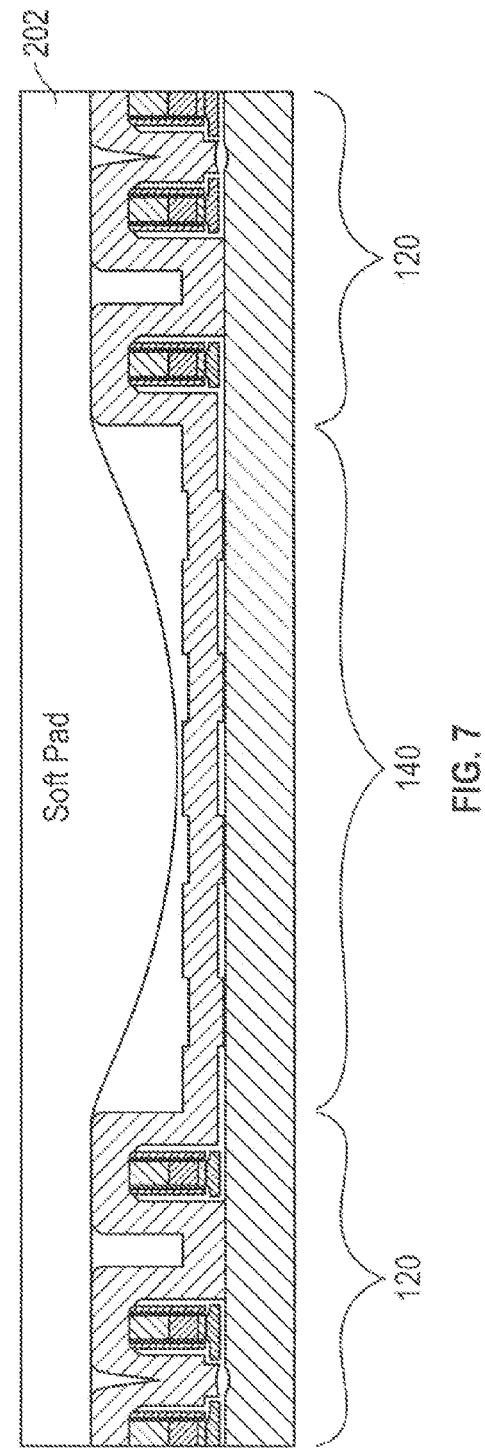

The CMP process contains a large number of variables and interactions, and polishing of the wafer surface depends on variables such as the polishing pad, polishing slurry, and the shape of the wafer, each of which includes secondary variables that dictate the ability of each constituent of the process to perform. Regarding the characteristics of the polishing pad, the pad may either be characterized as "hard" or "soft". As soft pads tend to be more conformal, it may be expected that they will produce higher material removal rates, but with the disadvantage of lower planarity capabilities. Hard pads, in contrast, will not remove material as fast, but will be more conformal. FIG. 6 illustrates a hard pad 201 applied to an integrated circuit topography similar to that shown in FIGS. 1 and 2, while FIG. 7 illustrates a soft pad 202 applied to such an integrated circuit topography. As shown, the soft pad in FIG. 7 demonstrates considerably more deviation from planarity across the contact area. Soft pads known in the art may be fabricated, for example, from a polyester felt material. One such example is known as the "Suba™ IV" pad manufactured by The Dow Chemical Company of Midland, Mich., USA. Hard pads known in the art may be fabricated, for example, from a polyurethane material. One such example is known as the "IC1000™" pad manufactured by The Dow Chemical Company of Midland, Mich., USA. Various other hard and soft pads made with various other materials are well known to those having ordinary skill in the art.

Figure 3:
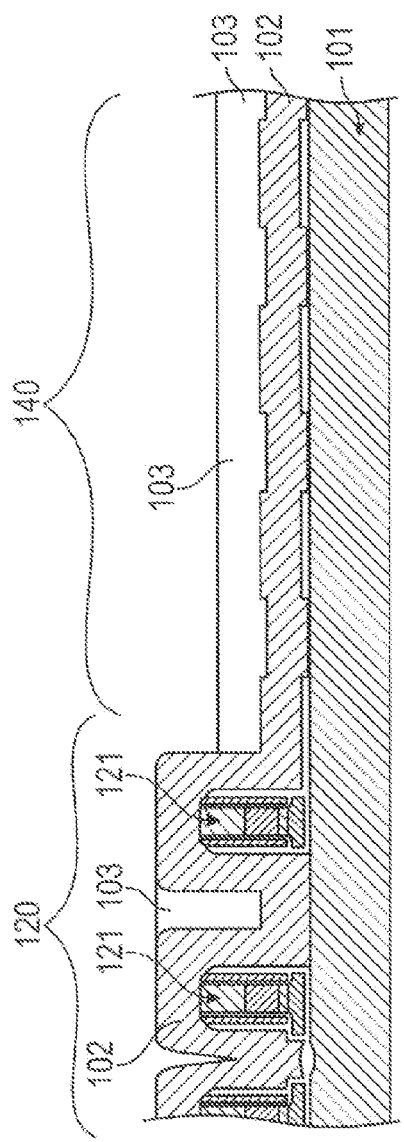

In accordance with the present disclosure, the first CMP step includes the application of a hard pad (see FIG. 6) to the integrated circuit shown in FIG. 2. The hard pad is able to maintain its planarity during the polishing process, and thus the capping layer is able to be removed from over the memory region 120 while remaining in place over the logic area 140. In addition to the hard pad, the first CMP step may employ a slurry chemical composition that is relatively more selective to the oxide capping layer than slurries used in the CMP process employed in the prior art. For example, the selectivity of the slurry used in the first CMP step may be, on the basis of polysilicon:silicon oxide:silicon nitride, about 200 to about 300:1:1. A dishing inhibitor may further be added to the slurry to prevent removal of the capping layer 103 in the logic region 140. In alternative embodiments, this selective slurry may be employed in the first CMP step regardless of the type of pad employed. The first CMP step is performed until the polysilicon layer in the memory region 120 is exposed. As shown in FIG. 3, after performing the first CMP step, the oxide capping layer 103 has been substantially removed (for example, greater than about 90% removed, or greater than about 95% removed) from over the memory region 120 (note though that some of layer 103 remains in the WL region 128 between the devices 121), while remaining in place in the logic region 140 to protect the polysilicon layer 102 thereunder from subsequent polishing steps.

Subsequent to the completion of the first CMP step, a second CMP step is then performed. In accordance with the present disclosure, the second CMP step includes the application of any type of pad to the integrated circuit shown in FIG. 3. The second CMP step may employ a slurry chemical composition that is relatively more selective to polysilicon than the slurry used in the first CMP step. For example, the selectivity of the slurry used in the second CMP step may be, on the basis of polysilicon:silicon oxide:silicon nitride, about 100:1:1 to about 600:1:1. This selective slurry may be employed in the second CMP step regardless of the type of pad employed. This highly-selective slurry allows the polysilicon layer 102 to be removed as desired, while leaving at least some thickness of the protective capping layer 103 in place over the logic region 140. The second CMP step is performed until the capping layer 126 of the memory devices 121 is exposed. As shown in FIG. 4, after performing the second CMP step, the polysilicon layer 103 has been substantially removed (for example, greater than about 90% removed, or greater than about 95% removed) from over the memory devices 121 in the memory region 120 (note though that polysilicon remains in the spaces between gate stacks), while at least part of the protective oxide capping layer 103 (for example, greater than about 20%, or greater than about 40% of the layer 103 present over region 140 after the first CMP step remains after the second CMP step, as measured by thickness, volume, etc.) remains in place in the logic region 140 to protect the polysilicon layer 102 thereunder.

In alternative embodiments, as noted initially above, the first/second CMP steps may be performed on the basis of differences in the chemical slurry employed, apart from any considerations of the type of pad employed. For example, as noted above, the first CMP step may be performed using a slurry that may have a selectivity, on the basis of polysilicon:silicon oxide:silicon nitride, about 200 to about 300:1:1, and the second CMP step may be performed using a slurry that may have a selectivity, on the basis of polysilicon:silicon oxide:silicon nitride, about 500:1:1. In these embodiments, the pads used for the first and second CMP steps may be both hard pads, both soft pads, or a different type of pad may be used in each step.

As such, by employing two separate CMP steps using different CMP process parameters (whether on the basis of pad type, slurry type, or both), the polysilicon layer is able to be polished as required while avoiding the need to remove the protective oxide capping layer thereover beforehand using the previously-described separate masking/patterning/etching steps. Thus, considerable time and expense is saved in the presently described process while not sacrificing any process integrity or reliability.

Thereafter, the process continues in the conventional manner by removing remaining portions the capping layer from over the first polysilicon layer in the logic device region. As illustrated in FIG. 5, the capping layer 103 is removed from the logic device region 140 in a step that is performed using, for example, the application of a suitable etching chemistry, such as a wet etching chemistry that is selective to silicon oxide materials. In one example, dilute hydrofluoric acid (dHF) may be used as a suitable wet etchant to etch the remaining portion of capping layer 103.

Fabrication of the integrated circuit may thereafter continue with further processing steps that can be performed to complete the fabrication the devices, as are well-known in the art (not illustrated). Further steps conventionally include, for example, the formation of metals gates, forming an insulating layer overlying the metal gates, the formation of doped source and drain regions, the formation of contacts (formed by depositing a photoresist material layer over the insulating layer, lithographic patterning, etching to form contact voids, and depositing a conductive material in the voids to form the contacts), and the formation of one or more patterned conductive layers across the device above the insulating layer, among many others. The subject matter disclosed herein is not intended to exclude any subsequent processing steps to form and test the completed integrated circuit as are known in the art. Furthermore, with respect to any of the process steps described above, one or more heat treating and/or annealing procedures can be employed after the deposition of a layer, as is commonly known in the art.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A method for fabricating an integrated circuit comprising:
   forming a silicon material layer over a semiconductor substrate, the semiconductor substrate including a logic device region and a memory array region, the memory array region having formed on the semiconductor substrate a memory device;
   forming a capping layer over the silicon material layer and over the memory device;
   removing the capping layer from over the memory device in the memory array region using a first chemical mechanical polishing process while leaving at least a first portion of the capping layer in place over the logic device region; and
   removing the first silicon material layer from over the memory device in the memory array region using a second chemical mechanical polishing process while leaving at least a second portion of the capping layer in place over the logic device region, the at least a second portion having a thickness that is less than the at least a first portion.

2. The method of claim 1, wherein forming the silicon material layer over the semiconductor substrate comprises forming a polycrystalline silicon material layer over the semiconductor substrate.

3. The method of claim 1, wherein forming the capping layer over the silicon material comprises forming a silicon oxide capping layer over the silicon material.

4. The method of claim 1, wherein performing the first chemical mechanical polishing process comprises applying a hard pad to the semiconductor substrate.

5. The method of claim 4, wherein performing the first chemical mechanical polishing process comprises applying a slurry having a selectivity on the basis of polysilicon:silicon oxide:silicon nitride of about 200 to about 300:1:1.

6. The method of claim 1, wherein performing the first chemical mechanical polishing process comprises applying a slurry having a selectivity on the basis of polysilicon:silicon oxide:silicon nitride of about 200 to about 300:1:1.

7. The method of claim 1, wherein performing the second chemical mechanical polishing process comprises applying a soft pad to the semiconductor substrate.

8. The method of claim 7, wherein performing the second chemical mechanical polishing process comprises applying a slurry having a selectivity on the basis of polysilicon:silicon oxide:silicon nitride of about 500:1:1.

9. The method of claim 1, wherein performing the second chemical mechanical polishing process comprises applying a slurry having a selectivity on the basis of polysilicon:silicon oxide:silicon nitride of about 500:1:1.

10. The method of claim 1, wherein the logic device region and the memory array region are formed on a single layout block of the integrated circuit.

11. The method of claim 1, further comprising removing the at least a second portion of the capping layer from over the first silicon material layer in the logic device region.

12. The method of claim 11, wherein removing the at least a second portion of the capping layer from over the first silicon material layer comprises applying a dilute HF wet etch.

13. The method of claim 1, wherein performing the first chemical mechanical polishing process comprises applying a slurry having a selectivity on the basis of polysilicon:silicon oxide:silicon nitride of about 200 to about 300:1:1 and wherein performing the second chemical mechanical polishing process comprises applying a slurry having a selectivity on the basis of polysilicon:silicon oxide:silicon nitride of about 500:1:1.

14. A method for fabricating an integrated circuit comprising:
  forming a silicon material layer over a semiconductor substrate, the semiconductor substrate including a logic device region and a memory array region, the memory array region having formed on the semiconductor substrate a memory device;
  forming a capping layer over the silicon material layer and over the memory device;
  removing the capping layer from over the memory device in the memory array region using a first chemical mechanical polishing process while leaving at least a first portion of the capping layer in place over the logic device region, wherein performing the first chemical mechanical polishing process comprises applying a hard pad to the semiconductor substrate; and
  removing the first silicon material layer from over the memory device in the memory array region using a second chemical mechanical polishing process while leaving at least a second portion of the capping layer in place over the logic device region, the at least a second portion having a thickness that is less than the at least a first portion, wherein performing the second chemical mechanical polishing process comprises applying a soft pad to the semiconductor substrate.

15. The method of claim 14, wherein forming the silicon material layer over the semiconductor substrate comprises forming a polycrystalline silicon material layer over the semiconductor substrate.

16. The method of claim 14, wherein forming the capping layer over the silicon material comprises forming a silicon oxide capping layer over the silicon material.

17. The method of claim 14, further comprising removing the at least a second portion of the capping layer from over the first silicon material layer in the logic device region by applying a dilute HF wet etch.

* * * * *